United States Patent
Wu

(10) Patent No.: US 11,402,555 B2
(45) Date of Patent: Aug. 2, 2022

(54) DISPLAY PANEL, MANUFACTURING METHOD THEREFOR AND DISPLAY DEVICE

(71) Applicants: CHONGQING HKC OPTOELECTRONICS TECHNOLOGY CO., LTD., Chongqing (CN); HKC CORPORATION LIMITED, Shenzhen (CN)

(72) Inventor: Chuan Wu, Chongqing (CN)

(73) Assignees: CHONGQING HKC OPTOELECTRONICS TECHNOLOGY CO., LTD., Chongqing (CN); HKC CORPORATION LIMITED, Shenzhen (CN)

( * ) Notice: Subject to any disclaimer, the term of this patent is extended or adjusted under 35 U.S.C. 154(b) by 887 days.

(21) Appl. No.: 16/313,899

(22) PCT Filed: Oct. 31, 2018

(86) PCT No.: PCT/CN2018/112871
§ 371 (c)(1),
(2) Date: Dec. 28, 2018

(87) PCT Pub. No.: WO2020/052020
PCT Pub. Date: Mar. 19, 2020

(65) Prior Publication Data
US 2021/0231846 A1  Jul. 29, 2021

(30) Foreign Application Priority Data
Sep. 12, 2018 (CN) .......................... 201811059237.1

(51) Int. Cl.
G02F 1/1335 (2006.01)
G02B 5/20 (2006.01)
H01L 27/32 (2006.01)

(52) U.S. Cl.
CPC ....... G02B 5/201 (2013.01); G02F 1/133516 (2013.01); H01L 27/322 (2013.01)

(58) Field of Classification Search
CPC .................... G02F 1/133516; G02F 1/133514
See application file for complete search history.

(56) References Cited

U.S. PATENT DOCUMENTS 8,951,700 B2    2/2015  Eom
2013/0155537 A1*  6/2013  Liu .................. G02F 1/133514
                                                  359/891

(Continued)

FOREIGN PATENT DOCUMENTS

CN    103176232 A    6/2013
CN    103984146 A    8/2014

(Continued)

OTHER PUBLICATIONS

Zifan Suo, the ISA written comments, dated Jun. 2019, CN.

*Primary Examiner* — Angela K Davison

(57) ABSTRACT

A display panel, a manufacturing method therefor and a display device are provided. The display panel includes a first substrate and color resists. An alignment film is formed on outer surfaces of the color resists. The first substrate includes a display color resist region and a dummy color resist region. A channel depth of the dummy color resist region is smaller than a channel depth of the display color resist region.

16 Claims, 3 Drawing Sheets

(56) References Cited

U.S. PATENT DOCUMENTS

| | | | | |
|---|---|---|---|---|
| 2014/0184972 A1* | 7/2014 | Park | ............... | G02F 1/133514 |
| | | | | 349/43 |
| 2015/0355500 A1* | 12/2015 | Kwon | ............... | G02F 1/133514 |
| | | | | 349/43 |
| 2020/0019022 A1* | 1/2020 | Nakamura | ......... | C08G 73/1042 |

FOREIGN PATENT DOCUMENTS

| | | |
|---|---|---|
| CN | 104570461 A | 4/2015 |
| CN | 104656323 A | 5/2015 |
| CN | 107422408 A | 12/2017 |
| CN | 107678200 A | 2/2018 |

\* cited by examiner

DISPLAY PANEL, MANUFACTURING METHOD THEREFOR AND DISPLAY DEVICE

This application claims priority to Chinese Patent Application No. CN201811059237.1, filed with the Chinese Patent Office on Sep. 12, 2018 and entitled "DISPLAY PANEL, MANUFACTURING METHOD THEREFOR, AND DISPLAY DEVICE HAVING SAME", which is incorporated herein by reference in its entirety.

TECHNICAL FIELD

This application relates to the field of display technologies, and more particularly, to a display device, a manufacturing method therefor and a display device.

BACKGROUND

The description herein provides only background information related to this application, but does not necessarily constitute the prior art. Along with the development and progress of sciences and technologies, a liquid crystal display has become a mainstream display product and an important display platform for present information technology (IT) and video products because of the advantages of thin body, power saving, low radiation and the like. Displays adopting active on-off control include liquid crystal displays, organic light-emitting diode (OLED) displays and the like. A large majority of liquid crystal displays on the market are backlight type liquid crystal displays which include liquid crystal panels and backlight modules. A working principle of a liquid crystal panel is that liquid crystal molecules are placed between two parallel glass substrates, and a drive voltage is applied to the two glass substrates to control rotation directions of the liquid crystal molecules, so as to refract light of a backlight module to generate a picture. An OLED display, also called an organic electroluminescent display, has many advantages such as auto luminescence, short response time, high definition and contrast, and capabilities of implementing flexible display and large-area full-color display. It has high performance and great market potential, and thus attracts numerous manufacturers and scientific research institutions all over the world to be devoted to production, research and development of OLED display panels.

A manufacturing process for a first substrate of a thin fin transistor (TFT) is usually as follows: a black matrix layer is prepared on a cleaned substrate, then a color resist is deposited, the substrate is totally covered with a conducting thin film, photo spacers (PSs) are prepared, coating with an alignment fluid (alignment film) is performed, and the first substrate is baked until the alignment fluid becomes a dry film covering the first substrate. An injection manner is usually adopted for coating with the alignment fluid, and an edge of a display region is coated with the alignment fluid. Since the alignment fluid is liquid, the edge of the display region is usually coated with the alignment fluid, and the alignment fluid on the edge may be diffused to a dummy color resist layer outside the display region to ensure that the whole display region is completely covered by the alignment fluid.

When a dummy color resist is designed, there may be the condition that the alignment fluid is hardly diffused out of the display region.

SUMMARY

An objective of this application is to provide a display panel, a manufacturing method therefor and a display device, so that an alignment fluid is diffused out of a display region.

To achieve the foregoing objective, this application adopts a display panel, a manufacturing method therefor and a display device. The display panel comprises:

a first substrate and a second substrate, color resists being arranged on the first substrate; and the first substrate comprising a display region and a non-display region arranged on an outer side of the display region, wherein the display region comprises a display color resist region;

the non-display region comprises a dummy color resist region;

the color resists comprise dummy color resists arranged in the dummy color resist region and display color resists arranged in the display color resist region;

a channel depth of the dummy color resist region is smaller than a channel depth of the display color resist region; and an alignment film is formed on outer surfaces of the display color resists and the dunny color resists.

Optionally, the dummy color resists comprise a first dummy color resist and a second dummy color resist which are sequentially arranged, and a sidewall of the second dummy color resist is covered with the first dummy color resist.

Optionally, part of a top surface, close to the first dummy color resist, of the second dummy color resist is also covered with the first dummy color resist.

Optionally, in case of such a range that the thickness of the first dummy color resist is more than or equal to 0.5 micron and less than or equal to 5 microns and the thickness of the second dummy color resist is more than or equal to 0.5 micron and less than or equal to 5 microns, the width of a lamination region between the first dummy color resist and the second dummy color resist is more than or equal to 1 micron and less than or equal to 30 microns.

Optionally, the display region is completely covered with the alignment film, and the dummy color resist region is partially or completely covered with the alignment film.

Optionally, a spacing slot is formed between any two display color resists and the dummy color resists are arranged in a mutual lamination manner.

This application further discloses a manufacturing method for a display panel, including a process of forming a first substrate, wherein the process of forming the first substrate comprises the following steps:

forming a display color resist region on a substrate and simultaneously forming a dummy color resist region with an even and channel-free outer suffice on a periphery of the display color resist region; and injecting an alignment liquid to outer surfaces of the display color resist region and the dummy color resist region to form an alignment film.

Optionally, in the step of forming the display color resist region on the substrate and simultaneously forming the dummy color resist region with the even and channel-free outer surface on the periphery of the display color resist region, a first dummy color resist, next to the display region, of the dummy color resist region is formed; and a display color resist, close to the dummy color resist, of the display color resist region is formed, and a sidewall of the first dummy color resist is covered with one end, close to the first dummy color resist, of the display color resist.

Optionally, in the step of forming the dummy color resist region with the even and channel-free outer surface on the periphery of the display color resist region, a third dummy color resist of which the thickness is more than or equal to 0.5 micron and less than or equal to 5 microns is formed;

a second dummy color resist of which the thickness is more than or equal to 0.5 micron and less than or equal to 5 microns is formed, and a sidewall of the second dummy color resist is covered with one end, close to the third dummy color resist, of the second dummy color resist;

a first dummy color resist of which the thickness is more than or equal to 0.5 micron and less than or equal to 5 microns is formed, and a sidewall of the first dummy color resist is covered with one end, close to the second dummy color resist, of the first dummy color resist; and distances between the first dummy color resist, the second dummy color resist and the third dummy color resist of the same group and the display region are progressively increased in sequence.

This application further discloses a display device, including the foregoing display panel.

According to this application, in the process of forming the first substrate, the non-display region is arranged on the outer side of the display region, and the dummy color resists are arranged in the dunny color resist region of the non-display region, so that the problem of width inconsistency between a middle part of the display region and the display color resist region on an edge of the display region is solved. The display color resist region is arranged in the display region, so that colors may be displayed by the display panel. The surface evenness of the dummy color resists of the dummy color resist region is higher than the surface evenness of the display color resist region of the display region, so that the alignment film may be uniformly and completely laid on the outer surface of the display color resist region and diffused to the dummy color resists.

BRIEF DESCRIPTION OF DRAWINGS

The accompanying drawings included are used for helping understand the embodiments of this application, constitute a part of this specification, illustrate examples of the embodiments of this application and, together with the description, serve to explain the principles of this application. Apparently, the accompanying drawings in the following description merely show some embodiments of this application, and persons of ordinary skill in the art may still derive other drawings from these accompanying drawings without creative effort. In the figures.

DETAILED DESCRIPTION

Figure 1:
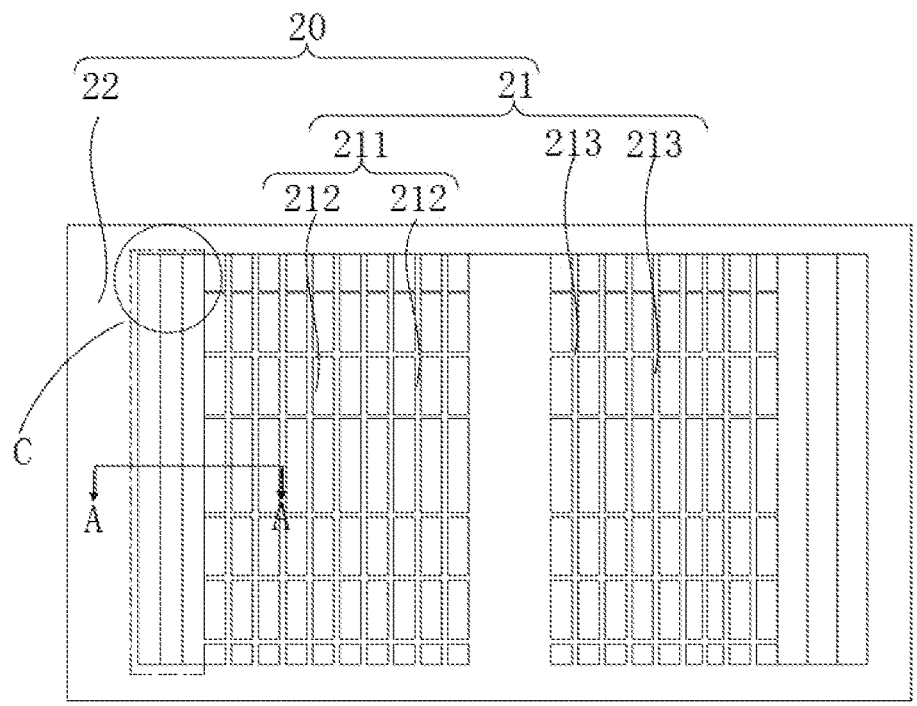
FIG. 1 is a schematic diagram of a display panel according to an embodiment of this application.
Figure 2:
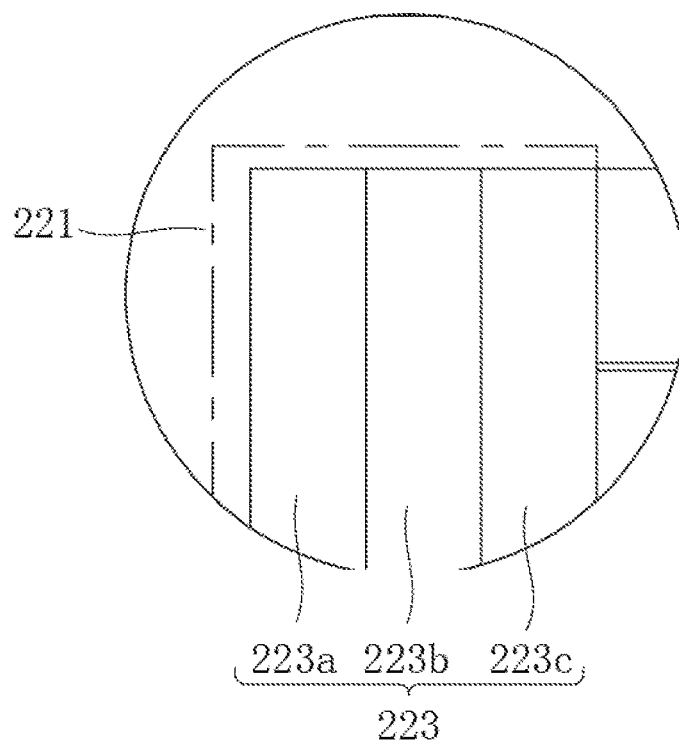
FIG. 2 is an enlarged schematic diagram of a part C of a display panel according to an embodiment of this application.
Figure 3:
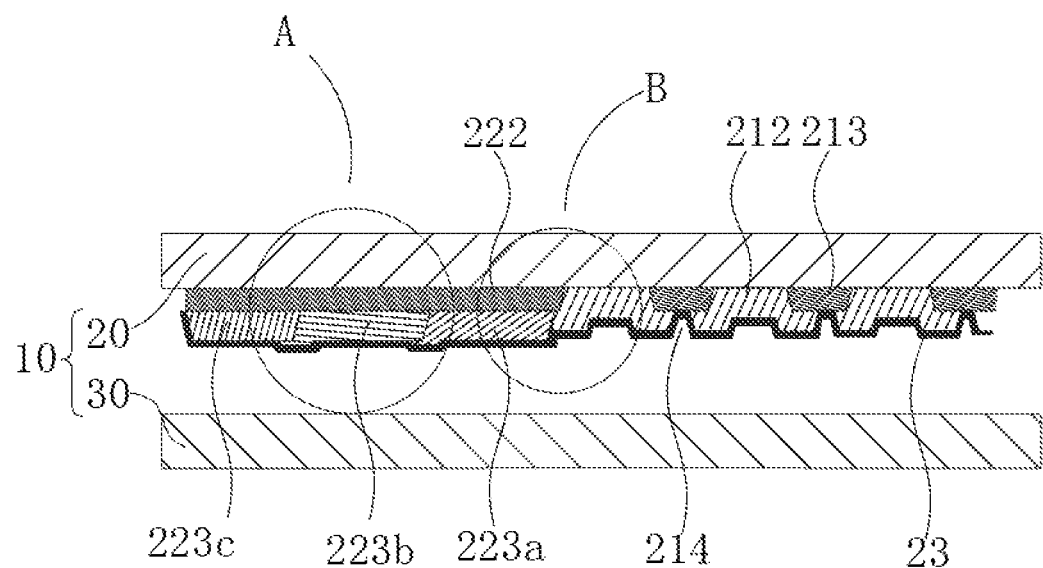
FIG. 3 is a sectional view of a part AA' of a display panel according to an embodiment of this application.
Figure 4:
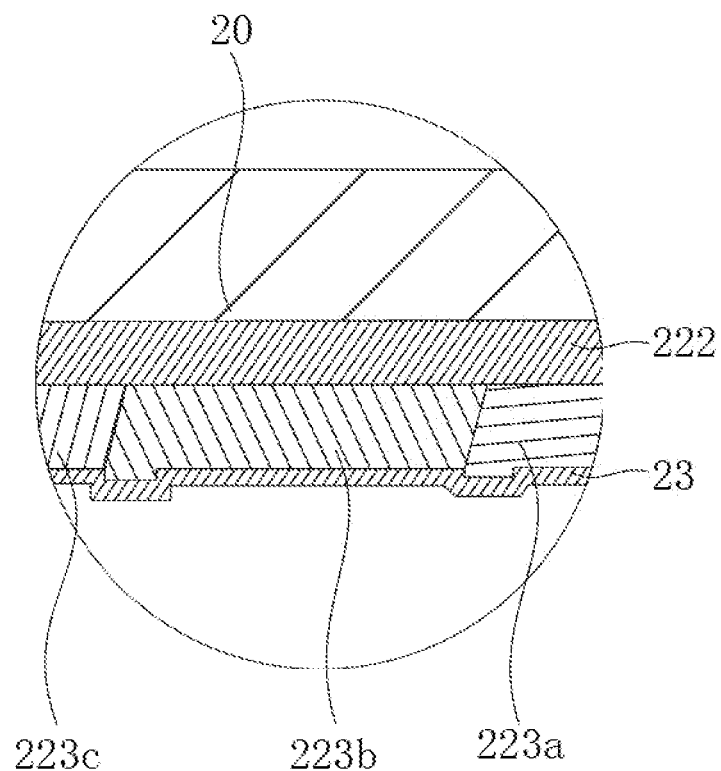
FIG. 4 is an enlarged schematic diagram of a sectional part. A of a part AA' of a display panel according to an embodiment of this application.

Specific structures and functional details disclosed herein are merely representative, and are intended to describe the objectives of the exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse", "on", "below", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly include one or more of said features. In the description of this application, unless otherwise stated, "a plurality of" means two or more than two. In addition, the terms "include", "include" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in this application according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "include" when used in this specification, specify the presence of stated features, integers, steps, operations, elements, and/or components, but do not preclude the presence or addition of one or more other features, integers, steps, operations, elements, components, and/or combinations thereof.

This application is further described below with reference to the accompanying drawings and embodiments.

As shown in FIG. 1 to FIG. 6, an embodiment of this application discloses a display panel, a manufacturing method therefor and a display device. The display panel includes a first substrate 20 and a second substrate 30. Color resists are arranged on the first substrate 20.

The first substrate 20 includes a display region 21 and a non-display region arranged on an outer side of the display region 21.

The display region 21 includes a display color resist region 211.

The non-display region 22 includes a dummy color resist region 221.

Dummy color resists 223 are arranged on the dummy color resist region 221, and a channel depth of the dummy color resist 223 of the non-display region 22 is smaller than a channel depth of the display color resist region 211 of the display region 21.

An alignment film 23 is formed on outer surfaces of the display color resist region 211 and the dummy color resists 223.

In a process of forming the first substrate 20, the non-display region 22 is arranged on the outer side of the display region 21, and the dummy color resists 223 are arranged in the dummy color resist region 221 of the non-display region 22, so that the problem of width inconsistency between a middle part of the display region 21 and the display color resist region 211 on an edge of the display region 21 is solved. The display color resist region 211 is arranged in the display region 21, so that colors may be displayed by the display panel 10. The surface evenness of the dummy color resists 223 of the dummy color resist region 221 is higher than the surface evenness of the display color resist region 211 of the display region 21, so that the alignment film 23 may be uniformly and completely laid on the outer surface of the display color resist region 211 and diffused to the dummy color resists 223.

Another embodiment of this application, referring to FIG. 1 to FIG. 6, discloses a first substrate 20 and a second substrate 30. Color resists are arranged on the first substrate 20.

The first substrate 20 includes a display region 21 and a non-display region arranged on an outer side of the display region 21.

The display region 21 includes a display color resist region 211.

The non-display region 22 includes a dummy color resist region 221.

Dummy color resists 223 are arranged on the dummy color resist region 221, and the surface evenness of the dummy color resist 223 of the non-display region 22 is higher than the surface evenness of the display color resist region 211 of the display region 21.

An alignment film 23 is formed on outer surfaces of the display color resist region 211 and the dummy color resists 223.

In a process of forming the first substrate 20, the non-display region 22 is arranged on the outer side of the display region 21, and the dummy color resists 223 are arranged in the dummy color resist region 221 of the non-display region 22, so that the problem of width inconsistency between a middle part of the display region 21 and the display color resist region 211 on an edge of the display region 21 is solved. The display color resist region 211 is arranged in the display region 21, so that colors may be displayed by the display panel 10. The surface evenness of the dummy color resists 223 of the dummy color resist region 221 is higher than the surface evenness of the display color resist region 211 of the display region 21, so that the alignment film 23 may be uniformly and completely laid on the outer surface of the display color resist region 211 and diffused to the dummy color resists 223.

According to the present embodiment, optionally, the dummy color resists 223 include a first dummy color resist 223a and a second dummy color resist 223b which are sequentially arranged, and a sidewall of the second dummy color resist 223b is covered with the first dummy color resist 223a.

The first dummy color resist 223a and the second dummy color resist 223b are sequentially arranged, and two adjacent color resists cling to each other to ensure that a channel depth between the two color resists is reduced. In such a manner, when an alignment fluid is injected in a process of forming the alignment film 23 after the dummy color resists 223 are formed, the alignment fluid may be smoothly diffused to the dunny color resist region 221 after filling the display-region 21, then it may be ensured that the display region 21 may completely be covered with the alignment fluid, good properties of the formed alignment film 23 may be ensured, and improvement of a display effect of the display panel 10 and increase of the yield of a product are facilitated.

Herein, arrangement of the dummy color resists further includes arrangement of at least one group of dummy color resists 223. Distances between the first dummy color resist 223a, the second dummy color resist 223b and a third dummy color resist 223c of the same group and the display region 21 are progressively increased in sequence.

One end, far away from the display region 21, of the first dummy color resist 223a is laminated with one end, close to the display region 21, of the second dummy color resist 223b, and one end, far away from the display region 21, of the second dummy color resist 223b is laminated with one end, close to the display region 21, of the third dummy color resist 223c.

Two ends of each of the first dunny color resist 223a and the second dummy color resist 223b are both inclined towards a direction far away from the display region 21 and are partially overlapped on an inclined surface of the outer dummy color resist 223.

When the color resists are deposited, the third dummy color resist 223c is deposited at first, one end, close to the display region 21, of the third dummy color resist 223c is inclined towards a direction far away from the display region 21, one end far away from the display region 21 is inclined towards the display region 21, an overlapping region of laminated parts of the second dunny color resist 223b and the third dummy color resist 223c is above the lamination region, and an overlapped part, positioned above the third dummy color resist 223c, of the second dummy color resist 223b forms a protrusion because an illumination width is constant and etching is not implemented above a position where the second dummy color resist 223b and the third dummy color resist 223c are overlapped during etching of the second dummy color resist 223b. Two ends of the first dummy color resist 223a and the second dummy color resist 223b are all inclined towards the direction far away from the display region 21 and are partially overlapped on the inclined surface of the outer dummy color resist 223. An overlapped part, positioned above the second dummy color resist 223b, of the first dummy color resist 223a forms a protrusion because the illumination width is constant and etching is not implemented above an overlapped position during etching of the first dummy color resist 223a.

Figure 6:
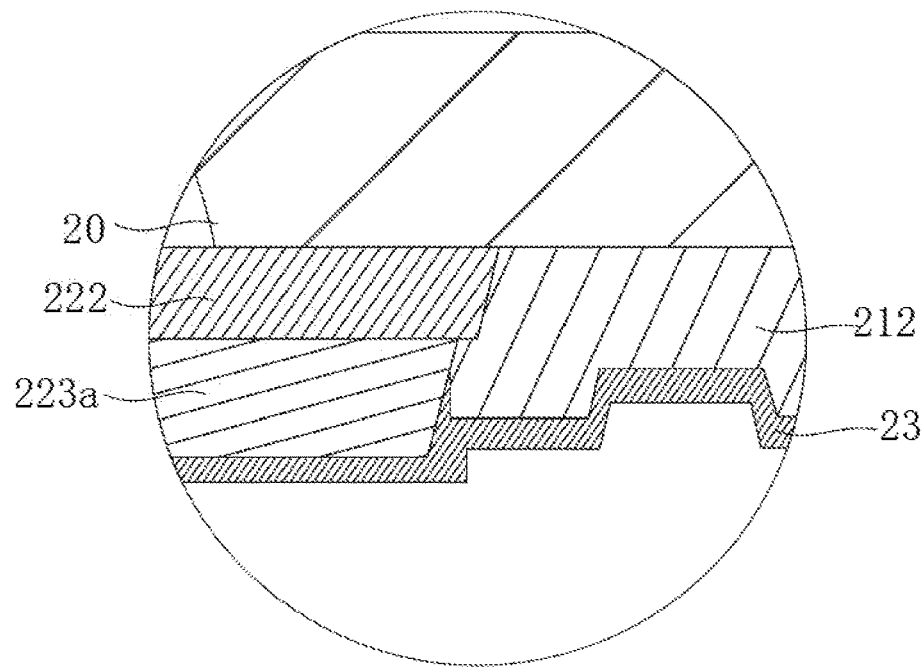
FIG. 6 is an enlarged schematic diagram of a lamination region B of a display color resist and a dummy color resist of a display panel according to an embodiment of this application.

According to the present embodiment, optionally, as shown in FIG. 6, a sidewall of one end, close to the display color resist region 211, of the dunny color resist region 221 is covered with one end of the display color resist region 211.

In the solution, under a normal condition, it is likely to form channels or gaps at a joint of the display region 21 and the dummy color resist region 221, which is unfavorable for diffusion of the alignment fluid. In the solution of this application, the display color resist region 211 and the dummy color resist region 221 cling to each other, so that the channels between the dummy color resist region 221 and the display color resist region 211 are reduced and even eliminated. Therefore, after the alignment fluid is injected, diffusion of the alignment fluid to the dummy color resist region 221 is facilitated, the display region 21 may further be completely covered with the alignment fluid, good properties of the formed alignment film 23 may be ensured, and improvement of the display effect of the display panel 10 and increase of the yield of the product are facilitated.

Figure 5:
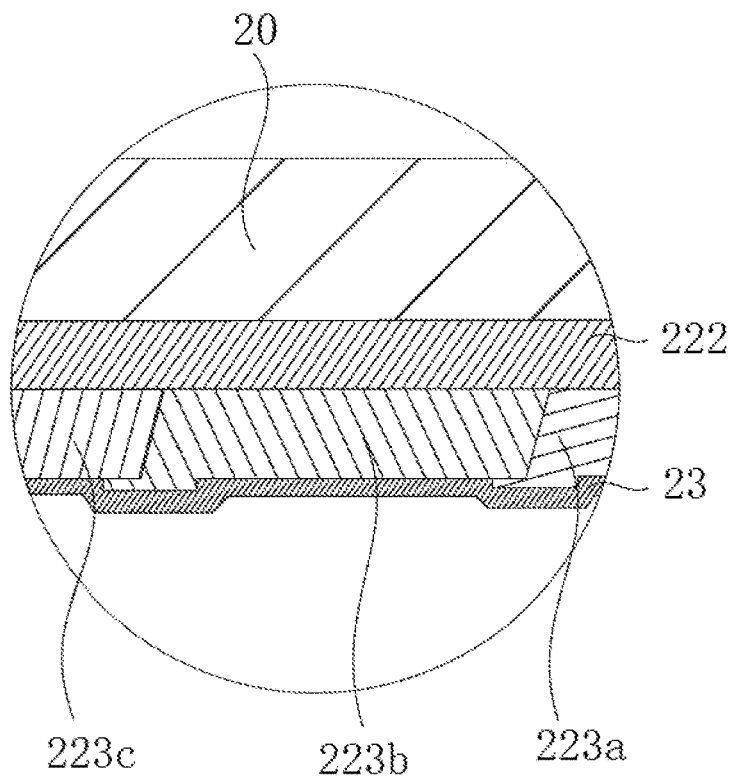
FIG. 5 is an enlarged schematic diagram of a sectional part. A of a part AA' of another display panel according to an embodiment of this application.

As shown in FIG. 5, a small part of the outer surface of the outer dunny color resist 223, besides the inclined plane, may also be overlapped.

According to the present embodiment, optionally, in case of such a range that the thickness of the first dummy color resist 223a is more than or equal to 0.5 micron and less than or equal to 5 microns, the thickness of the second dummy color resist 223b is more than or equal to 0.5 micron and less than or equal to 5 microns, and the thickness of the third dummy color resist 223c is more than or equal to 0.5 micron and less than or equal to 5 microns, the widths of lamination regions between every two of the first dummy color resist 223a, the second dummy color resist 223b and the third dummy color resist 223c are more than or equal to 1 micron and less than or equal to 30 microns.

In such a thickness range that the thickness of the first dummy color resist 223a is more than or equal to 0.5 micron and less than or equal to 5 microns, the thickness of the second dummy color resist 223b is more than or equal to 0.5 micron and less than or equal to 5 microns, and the thickness of the third dummy color resist 223c is more than or equal to 0.5 micron and less than or equal to 5 microns, the widths of the lamination regions between every two of the first dummy color resist 223a, the second dummy color resist 223b and the third dummy color resist 223c are more than or equal to 1 micron and less than or equal to 30 microns, so that a ratio of the thicknesses to overlapping regions between the dummy color resists 223 is ensured, and in case of over-ranging, display problems caused by excessively large overlapping regions between the dummy color resists 223 and the problem, caused by excessively small overlapping regions, that channels are formed between the dummy color resists 223 to make it impossible to diffuse the alignment fluid are prevented.

According to the present embodiment, optionally, the display region 21 is completely covered with the alignment film 23, and the dummy color resist region 221 is partially or completely covered with the alignment film 23.

The alignment film 23 is also formed in the dummy color resist region 221 to ensure that the display region 21 is completely covered with the alignment film 23. The dummy color resist region 221 may not be completely covered. The condition that no alignment fil 23 is in an edge region of the display region 2,1 thus influencing display of the first substrate 20 is prevented.

According to the present embodiment, optionally, a spacing slot 214 is formed between any two display color resists 212, and the dummy color resists 223 are arranged in a mutual lamination manner.

The spacing slot 214 is formed between the display color resists 212, the spacing slot 214 is shaped into a groove lower than the display color resists 212 to form an uneven state, and the dummy color resists 223 are seamlessly laminated at contact positions, so that the surface of the dummy color resist region 221 is more even than the groove between the display color resist regions 211, the alignment fluid may flow to the dummy color resist region 221 more easily, brightness differences caused by accumulation of the alignment fluid on the edge of the display region 21 between the middle part of the display region 21 of the display panel 10 and the edge region of the display region 21 are avoided, and the production yield of the display panel 10 is ensured.

According to the present embodiment, optionally, a process of forming the first substrate 20 is included. The process of forming the first substrate 20 incudes the following steps.

The display color resist region 211 is formed on a substrate and the dummy color resist region 221 with an even and channel-free outer surface is simultaneously formed on a periphery of the display color resist region 211.

The alignment liquid is injected to outer surfaces of the display color resist region 211 and the dummy color resist region 221 to form the alignment film 23.

In the process of forming the first substrate 20, the dummy color resist region 221 is arranged on the outer side of the display region 21, so that the problem of width inconsistency between the middle part of the display region 21 and the display color resist region 211 on the edge of the display region 21 is prevented. First black matrixes 213 are different from second black matrixes 222. The first black matrixes 213 are arranged at intervals, and the display color resist regions 211 may be arranged in spacing regions for light transmission. The second black matrixes 222 are integrally laid, and are light-proof. The dummy color resists 223 arranged on outer surfaces of the second black matrixes 222 are also even and channel-free, so that the alignment film 23 may be uniformly and completely laid on the outer surface of the display color resist region 211.

According to the present embodiment, optionally, in the step that the display color resist region 211 is formed on the substrate and the dummy color resist region 221 with the even and channel-free outer surface is simultaneously formed on the periphery of the display color resist region 211, the first dummy color resist 223a, next to the display region 21, of the dummy color resist region 221 is formed; and the display color resist 212, close to the dummy color resist 223, of the display color resist region 211 is formed, and a sidewall of the first dummy color resist 223a is covered with one end, close to the first dummy color resist 223a, of the display color resist 212.

The dummy color resist region 221 with the even and channel-free outer surface is formed on the periphery of the display color resist region 211. It is likely to form channels or gaps at a joint of the display region 21 and the dummy color resist region 221, which is unfavorable for diffusion of the alignment fluid. In the solution of this application, the display color resist region 211 and the dummy color resist region 221 cling to each other, so that the channels between the dummy color resists 223 and the display color resist region 211 are reduced and even eliminated. Therefore, after the alignment fluid is injected, diffusion of the alignment fluid to the dummy color resist region 221 is facilitated, the display region 21 may be further completely covered with the alignment fluid, good properties of the formed alignment film 23 may be ensured, and improvement of the display effect of the display panel 10 and increase of the yield of the product are facilitated.

According to the present embodiment, optionally, in the step that the dummy color resist region 221 with the even and channel-free outer surface is formed on the periphery of the display color resist region 211, the third dunny color resist 223c of which the thickness is more than or equal to 0.5 micron and less than or equal to 5 microns is formed;

the second dummy color resist 223b of which the thickness is more than or equal to 0.5 micron and less than or equal to 5 microns is formed, and a sidewall of the second dummy color resist 223b is covered with one end, close to the third dummy color resist 223c, of the second dummy color resist 223b;

the first dummy color resist 223a of which the thickness is more than or equal to 0.5 micron and less than or equal to 5 microns is formed, and a sidewall of the first dummy color resist 223a is covered with one end, close to the second dummy color resist 223b, of the first dummy color resist 223a; and distances between the first dummy color resist 223a, the second dummy color resist 223b and the third dummy color resist 223c of the same group and the display region 21 are progressively increased in sequence.

In the solution, in the step that the dummy color resist region 221 with the even and channel-free outer surface is formed on the periphery of the display color resist region 211, in such a thickness range that the thickness of the first dummy color resist 223a is more than or equal to 0.5 micron and less than or equal to 5 microns, the thickness of the second dummy color resist 223b is more than or equal to 0.5 micron and less than or equal to 5 microns, not smaller than 0.5 micron and not larger than 5 microns, and the thickness of the third dummy color resist 223c is more than or equal to 0.5 micron and less than or equal to 5 microns, the widths of the lamination regions between every two of the first dummy color resist 223a, the second dunny color resist 223b and the third dummy color resist 223c are more than or equal to 1 micron and less than or equal to 30 microns, and the distances between the first dummy color resist 223a, the second dummy color resist 223b and the third dummy color resist 223c of the same group and the display region 21 are progressively increased in sequence, so that a ratio of the thicknesses to overlapping regions between the dummy color resists 223 is ensured, and in case of over-ranging, display problems caused by excessively large overlapping regions between the dummy color resists 223 and the problem, caused by excessively small overlapping regions, that channels are formed between the dummy color resists 223 to make it impossible to diffuse the alignment fluid are prevented.

Another embodiment of this application, referring to FIG. 1 to FIG. 6, discloses a display device, including the foregoing display panel 10.

The display panel of this application may be a twisted nematic (TN) panel, an in-plane switching (IPS) panel, or a multi-domain vertical alignment (VA) panel, and may certainly be any other suitable type of panel.

The foregoing contents are detailed descriptions of this application in conjunction with specific optionally embodiments, and it should not be considered that the specific implementation of this application is limited to these descriptions. Persons of ordinary skill in the art can further make simple deductions or replacements without departing from the concept of this application, and such deductions or replacements should all be considered as falling within the protection scope of this application.

What is claimed is:

1. A display panel, comprising:
a first substrate and a second substrate, color filters being arranged on the first substrate; and
the first substrate comprising a display region and a non-display region disposed on an outer side of the display region, wherein
the display region comprises a display color filter region;
the non-display region comprises a dummy color filter region;
the color filters comprise dummy color filters arranged in the dummy color filter region and display color filters arranged in the display color filter region;
a channel depth of the dummy color filter region is smaller than a channel depth of the display color filter region; and
an alignment film is formed on outer surfaces of the display color filters and the dummy color filters;
wherein the dummy color filters are arranged in at least one group, wherein each group of the dummy color filters comprises a first dummy color filter, a second dummy color filter, and a third dummy color filter that are sequentially arranged; and respective distances from the first dummy color filter, the second dummy color filter, and the third dummy color filter of the same group to the display region are progressively increased in sequence;
wherein a sidewall of the first dummy color filter facing away from the display region is at least partially attached to a sidewall of the second dummy color filter facing towards the display region, and wherein a sidewall of the second dummy color filter facing away from the display region is at least partially attached to a sidewall of the third dummy color filter facing towards the display region; and
wherein two sidewalls of each of the first dummy color filter and the second dummy color filter are both inclined away from the display region along a normal vector pointing from the first substrate to the second substrate, and wherein the sidewall of the first dummy color filter facing away from the display region overlaps the sidewall of the second dummy color filter facing towards the display region, and wherein the sidewall of the second dummy color filter facing away from the display region overlaps the sidewall of the third dummy color filter facing towards the display region.

2. The display panel according to claim 1, wherein a sidewall facing the non-display region of the display color filter nearest to the non-display region at least partially covers a side wall facing the display region of the first dummy color filter nearest to the display region.

3. The display panel according to claim 1, wherein the sidewall of the first dummy color filter facing away from the display region is partially stacked on a portion of a top surface of the second dummy color filter joined with the corresponding sidewall of the second dummy color filter adjacent to the first dummy color filter, and wherein the sidewall of the second dummy color filter facing away from the display region is partially stacked on a portion of a top surface of the third dummy color filter joined with the corresponding sidewall of the third dummy color filter adjacent to the second dummy filter.

4. The display panel according to claim 1, wherein the display region is completely covered with the alignment film, and the dummy color filter region is partially or completely covered with the alignment film.

5. The display panel according to claim 1, wherein a spacing groove is formed between every two display color filters, and wherein the dummy color filters are arranged such that sidewalls of every two adjacent dummy color filters are attached to and overlap each other.

6. The display panel according to claim 1, wherein the first dummy color filter covers the sidewall of the second dummy color filter adjacent to the first dummy color filter.

7. The display panel according to claim 6, wherein the first dummy color filter further covers a portion of a top surface of the second dummy color filter adjacent to the first dummy color filter.

8. The display panel according to claim 7, wherein when a thickness of the first dummy color filter is more than or equal to 0.5 micron and less than or equal to 5 microns, and a thickness of the second dummy color filter is more than or equal to 0.5 micron and less than or equal to 5 microns, then a width of an overlap region between the first dummy color filter and the second dummy color filter is more than or equal to 1 micron and less than or equal to 30 microns.

9. A manufacturing method adapted to a display panel, comprising a process of forming a first substrate, wherein the process of forming the first substrate comprises:
   forming a display color filter region on a substrate and forming a dummy color filter region with an even and channel-free outer surface on a periphery of the display color filter region; and
   injecting an alignment liquid onto outer surfaces of the display color filter region and the dummy color filter region to form an alignment film;
   wherein the operation of forming the display color filter region on the substrate and forming the dummy color filter region with the even and channel-free outer surface on the periphery of the display color filter region comprises:
   forming at least one group of dummy color filters on the periphery of the display region, wherein each group of the dummy color filters comprise a first dummy color filter, a second dummy color filter, and a third dummy color filter that are sequentially arranged on the periphery of the display region; wherein respective distances from the first dummy color filter, the second dummy color filter, and the third dummy color filter of the same group to the display region are progressively increased in sequence; wherein a sidewall of the first dummy color filter facing away from the display region is at least partially attached to a sidewall of the second dummy color filter facing towards the display region, and wherein a sidewall of the second dummy color filter facing away from the display region is at least partially attached to a sidewall of the third dummy color filter facing towards the display region; wherein two sidewalls of each of the first dummy color filter and the second dummy color filter are both inclined away from the display region along a normal vector pointing from the first substrate to the second substrate, and wherein the sidewall of the first dummy color filter facing away from the display region overlaps the sidewall of the second dummy color filter facing towards the display region, and wherein the sidewall of the second dummy color filter facing away from the display region overlaps the sidewall of the third dummy color filter facing towards the display region;
   and forming a display color filter of the display region adjacent to the first dummy color filter of the group of dummy color filters that is the nearest to the display region.

10. The manufacturing method for the display panel according to claim 9, wherein, in the forming the display color filter region on the substrate and forming the dummy color filter region with the even and channel-free outer surface on the periphery of the display color filter region,
    a sidewall facing the non-display region of the display color filter nearest to the non-display region at least partially covers a sidewall facing the display region of the first dummy color filter nearest to the display region.

11. The manufacturing method for the display panel according to claim 9, wherein the display region is completely covered with the formed alignment film, and the dummy color filter region is partially or completely covered with the formed alignment film.

12. The manufacturing method for the display panel according to claim 9, wherein a spacing groove is formed between every two display color filters, and the dummy color filters are arranged such that sidewalls of every two adjacent dummy color filters are attached to and overlap each other.

13. The manufacturing method for the display panel according to claim 9, wherein of the same group of dummy color filters the first dummy color filter further covers a portion of a top surface of the second dummy color filter adjacent to the first dummy color filter.

14. The manufacturing method for the display panel according to claim 13, wherein when a thickness of the first dummy color filter is more than or equal to 0.5 micron and less than or equal to 5 microns and a thickness of the second dummy color filter is more than or equal to 0.5 micron and less than or equal to 5 microns, then a width of an overlap region between the first dummy color filter and the second dummy color filter is more than or equal to 1 micron and less than or equal to 30 microns.

15. A display device, comprising a display panel, the display panel comprising:
    a first substrate and a second substrate, color filters being arranged on the first substrate; and
    the first substrate comprising a display region and a non-display region disposed on an outer side of the display region, wherein
    the display region comprises a display color filter region;
    the non-display region comprises a dummy color filter region;
    the color filters comprise dummy color filters arranged in the dummy color filter region and display color filters arranged in the display color filter region;
    a channel depth of the dummy color filter region is smaller than a channel depth of the display color filter region; and
    an alignment film is formed on outer surfaces of the display color filters and the dummy color filters;
    wherein the dummy color filters are arranged in at least one group, wherein each group of the dummy color filters comprises a first dummy color filter, a second dummy color filter, and a third dummy color filter that are sequentially arranged; and respective distances from the first dummy color filter, the second dummy color filter, and the third dummy color filter of the same group to the display region are progressively increased in sequence;
    wherein a sidewall of the first dummy color filter facing away from the display region is at least partially attached to a sidewall of the second dummy color filter facing towards the display region, and wherein a sidewall of the second dummy color filter facing away from the display region is at least partially attached to a sidewall of the third dummy color filter facing towards the display region; and wherein two sidewalls of each of the first dummy color filter and the second dummy color filter are both inclined away from the display region along a normal vector pointing from the first substrate to the second substrate, and wherein the sidewall of the first dummy color filter facing away from the display region overlaps the sidewall of the second dummy color filter facing towards the display region, and wherein the sidewall of the second dummy color filter facing away from the display region overlaps the sidewall of the third dummy color filter facing towards the display region.

16. The display device according to claim 15, wherein the first dummy color filter covers the sidewall of the second dummy color filter adjacent to the first dummy color filter.

* * * * *